United States Patent [19]

Carobolante

[11] Patent Number: 5,614,797
[45] Date of Patent: Mar. 25, 1997

[54] STATOR COIL DRIVER CIRCUIT FOR A BRUSHLESS DC MOTOR

[75] Inventor: Francesco Carobolante, Portola Valley, Calif.

[73] Assignee: SGS-Thomson Microelectronics, Inc., Carrollton, Tex.

[21] Appl. No.: 395,869

[22] Filed: Feb. 28, 1995

[51] Int. Cl.⁶ .......................................................... H02P 6/08
[52] U.S. Cl. ............................................ 318/432; 318/254
[58] Field of Search ................................... 318/138, 254, 318/432, 433, 439

[56] References Cited

U.S. PATENT DOCUMENTS

| | | | |
|---|---|---|---|
| 4,633,150 | 12/1986 | Inaji et al. | 318/254 |
| 4,987,352 | 1/1991 | Ishii | 318/254 |
| 5,017,845 | 5/1991 | Carobolante et al. | 318/138 |
| 5,172,036 | 12/1992 | Cameron | 318/138 |
| 5,173,645 | 12/1992 | Naito | 318/138 |
| 5,191,269 | 3/1993 | Carobolante | 318/254 |
| 5,196,771 | 3/1993 | Naito | 318/254 |
| 5,221,881 | 6/1993 | Cameron | 318/254 |
| 5,306,988 | 4/1994 | Carobolante et al. | 318/254 |
| 5,331,259 | 7/1994 | Naito | 318/254 |
| 5,397,967 | 3/1995 | Carobolante et al. | 388/800 |

*Primary Examiner*—Bentsu Ro
*Attorney, Agent, or Firm*—Joseph C. Arrambide; Theodore E. Galanthay; Robert Groover

[57] ABSTRACT

A stator coil driver circuit for a brushless DC motor, which minimizes torque ripple by keeping the current in the commutating phases constant, is disclosed. The circuit includes a slew rate control circuit for ramping up the current or ramping down the current during commutation. The slew rate control circuit consists of a capacitor, a first current source for charging the capacitor, and a second current source for discharging the capacitor. The circuit also includes a sense resistor or a sensefet and an operational transconductance amplifier for providing feedback control.

17 Claims, 3 Drawing Sheets

5,614,797

STATOR COIL DRIVER CIRCUIT FOR A BRUSHLESS DC MOTOR

BACKGROUND OF THE INVENTION

1. Field of the Invention

The present invention relates to a brushless direct current motors, and in particular, to the stator coil driver circuitry for the brushless direct current motor, and still more particularly to a slew rate control circuit for the driver circuit.

2. Technical Background

Brushless direct current motors (DC motors) are commonly used in disk drives, tape drives, video cassette players, and the like and are typically under stringent requirements regarding their performance in these applications. During the phase commutation of such a motor, which is achieved by switching off the current in one stator coil while at the same time switching on the current in another coil, current ripple has been a problem. It is known in the art that the commutation should be performed when the back electromotive force (BEMF) on the two coils is equal and the torque provided by each coil is also equal. Torque ripple has been a problem during commutation which results in undesirable acoustical noise produced by the motor and unnecessary wear on the motor.

FIG. 1 illustrates the typical architecture of a brushless DC motor as is known in the art. This architecture includes a motor 12, a commutator 20, a driver 22, and a voltage supply 24. The motor includes a rotor 14, a stator 16, and hall effect sensors 103. (Although this block diagram shows hall effect sensors, it is also known in the art to use the BEMF of a floating coil to determine the position of the rotor instead of using hall effect sensors.) The stator 16 includes stator coils 26a, 26b, and 26c configured in a wye configuration. In operation, the commutator block 20 sequentially selects the appropriate stator coil driver circuit in driver block 22 to drive current into or out of stator coils 16a, 16b, or 16c, as is known in the art. Hall effect sensors 103, in combination with rotor 14, provide the position information necessary so that the commutator circuit 20 can commutate the driver circuit 22 at the appropriate time. The operation of a typical disk drive is more fully described in U.S. Pat. Nos. 5,017,845, 5,172,036, 5,191,269, 5,221,881, and 5,306,988, and are fully incorporated into this specification by reference.

FIG. 2 shows a prior art circuit, which is described in detail in U.S. Pat. No. 5,191,269, used to reduce commutation ripple. This circuit reduces commutation ripple by using a combination of voltage slew-rate control on the phase which is turning off and a fast closing of the current loop through the phase which is turning on. More specifically, FIG. 2 shows stator coils 26a, 26b, and 26c in a wye configuration. A low side driver circuit for stator coil 26a is shown as including switch 56, current source 72, amplifier 70, capacitor 76, transistor 38. A low side driver circuit for stator coil 26b is shown as including switch 62, current source 84, amplifier 82, capacitor 88, transistor 44.

In FIG. 2, stator coil 26a is being turned off while stator coil 26b is being turned on. Upon the commutator causing the first switch 56 to open while causing the second switch 62 to close, the slew-rate control controls the rate of turn-off of the current flowing in the one phase while the current sensing resistor senses the sum of the current flowing in transistors 38 and 44. The current sensing resistor imposes a feedback voltage indicative of the summed current of transistors 38 and 44 at the inverting input of the operational amplifier 50. The operational amplifier 50 produces a voltage at the output representative of the voltage difference between the predetermined voltage of the voltage source and the feedback voltage, whereby the voltage difference at the gate of the second transistor controls the rate of turn-on of the other phase so that the total current in the phase is maintained constant through the commutation and is equal to Vin divided by the resistance of the sensing resistor 30.

The drawbacks to this approach are:

1. The technique does not work in pulse width modulation (PWM) mode since the slew-rate control is killed by the PWM operation, thus preventing a smooth current transition.
2. The fast turn-on of the phase controlling the current generates EMI, unless some circuitry is added to control turn-on slew-rate, potentially at the expense of current stability.
3. The circuit requires some extra circuitry to minimize delays when the commutations are effected from a "saturated" condition (i.e. gate overdrive) which is typically used when a series device is controlling the current such is in high power applications.
4. The overall predriver circuitry is rather complicated, partially because of all the above patches.

SUMMARY OF THE INVENTION

Therefore, it is an object of the invention to simplify the predriver circuitry.

It is another object of the invention to reduce EMI and acoustical noise in both linear and PWM modes.

It is yet another object of the invention to improve stability due to the absence of local feedback for slew rate control.

It is yet another object of the invention to be compatible with both low-side driver regulation and series pass regulation.

These and other objects, features, and advantages of the invention will be apparent to those skilled in the art from the following detailed description of the invention, when read with the drawing and pended claims.

In accordance with a broad aspect of the invention, a circuit to drive the stator coils of a polyphase DC motor is improved by including slew rate control circuitry to the driver circuitry. The slew rate control circuitry includes a capacitor, a current source for charging the capacitor, and a current source for discharging the capacitor. By using the slew rate control circuitry in combination with a sense resistor and operational transconductance amplifier feedback loop, constant current can be maintained in the coils during commutation which reduces torque ripple and EMI. The disclosed technique is effective in linear mode as well as in PWM mode.

DETAILED DESCRIPTION OF THE PREFERRED EMBODIMENT

Figure 1:
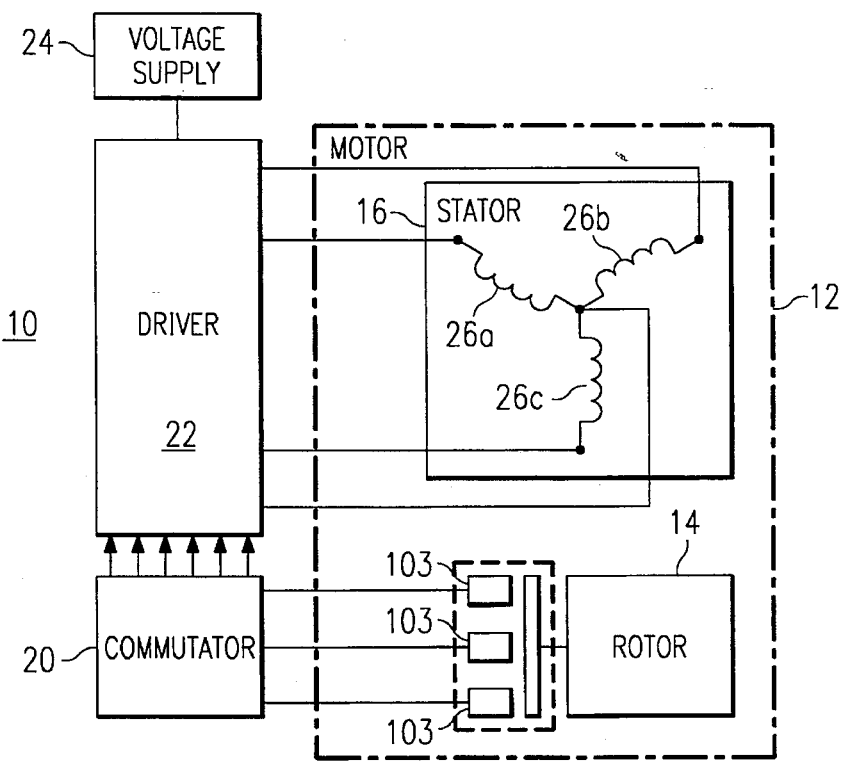
FIG. 1 is a block diagram of a conventional DC motor control circuit.
Figure 2:
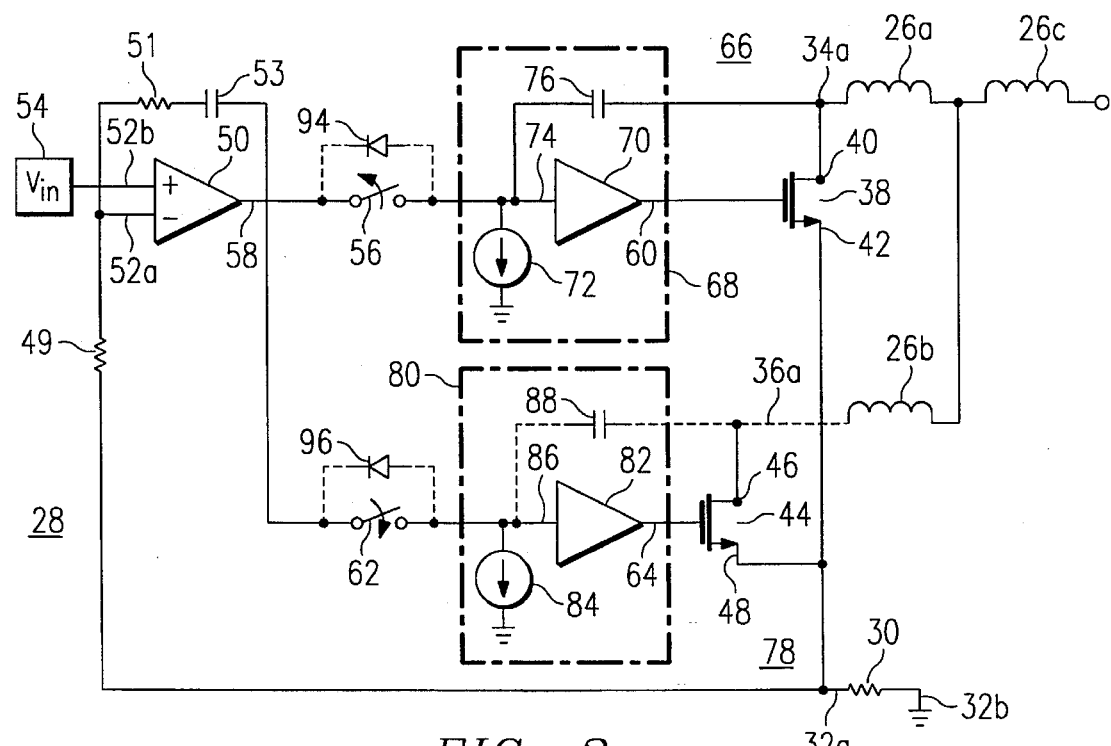
FIG. 2 is a schematic diagram of a prior art driver circuit.
Figure 3:
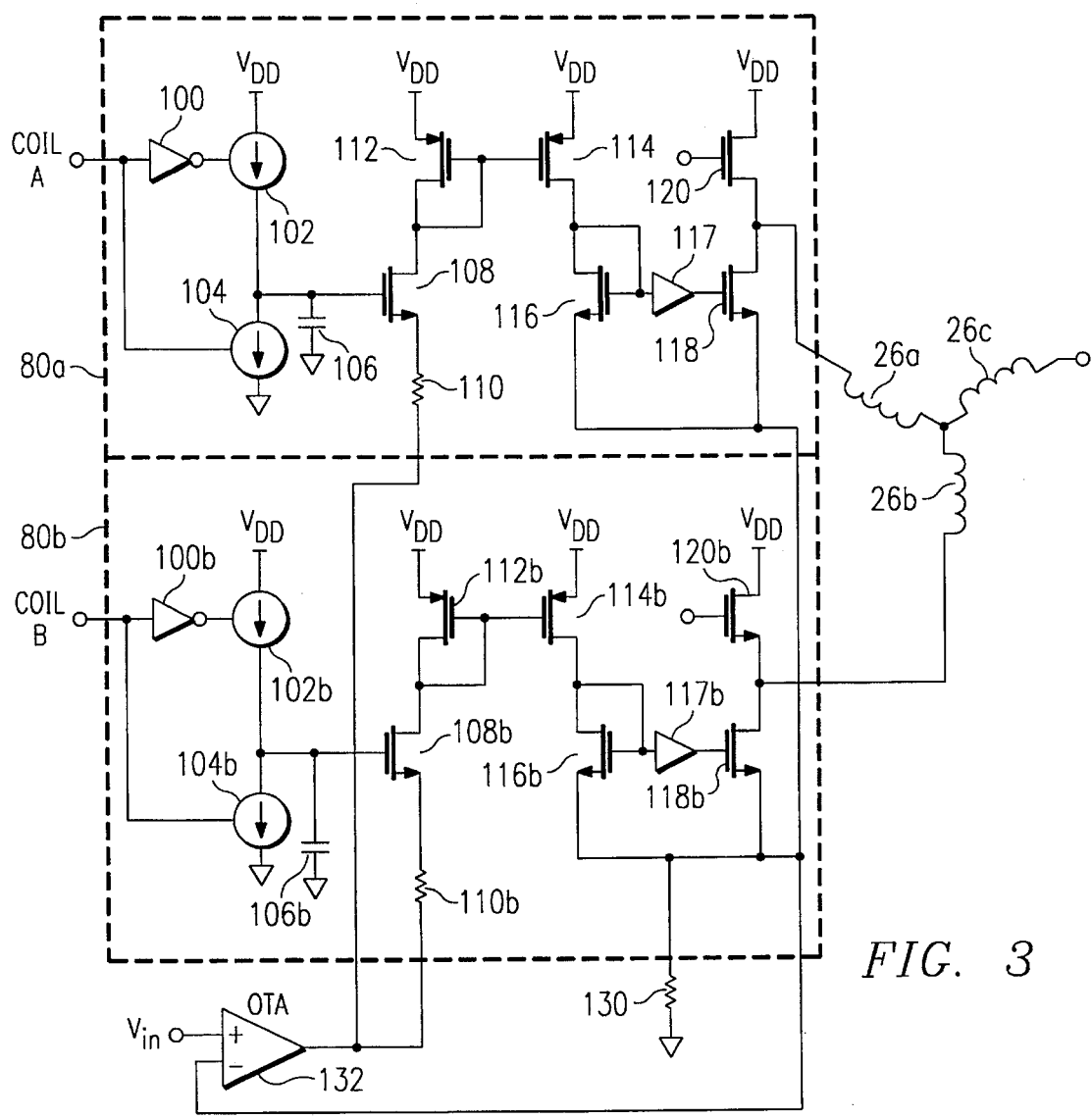
FIG. 3 is a schematic diagram of the preferred embodiment of a driver circuit, including a driver circuit.

A stator coil driver circuit constructed according to the preferred embodiment of the invention will be described. Referring now to FIG. 3, the stator coils 26a, 26b, and 26c are connected in a wye configuration. The driver circuit 80a for coil 26a is the same as the driver circuit 80b for coil 26b, as shown. Additionally, it is understood that typically three drive circuits would be preferable for driving three coils in a wye configuration.

The driver circuit for coil 26a includes inverter 100, which has an input for receiving a coil A control logic signal from commutator 20 and an output which is connected to the control element of current source 102. Current source 102 has a draining end connected to a supply voltage, Vdd, and a sourcing end connected to a draining end of current source 104, a first plate of capacitor 106, and a gate of N-channel MOSFET transistor 108. Current source 104 has a control element connected to the input of inverter 100 and has a source end connected to a voltage reference, ground. The second plate of capacitor 106 is connected to ground. Transistor 108 has a drain connected to a current mirror which is made up from P-channel MOSFET transistor 112 and P-channel MOSFET transistor 114. The source of transistor 108 is connected to a first end of resistor 110. The drain of transistor 108 is connected to the drain and gate of transistor 112 and the gate of transistor 114. The source of transistor 112 and 114 are connected to Vdd. The drain of transistor 114 is connected to the drain and gate of n-channel MOSFET transistor 116 and the input of unity gain buffer amplifier 117. The output of unity gain amplifier 117 is connected to the gate of n-channel MOSFET transistor 118. Transistor 116, buffer amplifier 117, and transistor 118 form the second current mirror where the buffer amplifier 117 improves the performance of the current mirror. The drain of transistor 118 is connected to the source of n-channel MOSFET transistor 120 and to one end of coil 26a. Transistor 120 is the high side driver transistor and transistor 118 is the low side driver for coil 26a. The highside drive is shown as unconnected although it is understood in the art that its gate would be connected to high side driver circuitry, as is known in the art. The sources of transistor 116 and 118 are connected to the first end of sense resistor 130, as is a similar transistor in driver circuit 80b. The second end of sense resistor 130 is connected to ground.

The driver circuit for coil 26b is constructed in an analogous manner as the driver circuit for coil 26a. The elements which function in the same manner are labeled with the same identification number, but additionally have a "b" added at the end of its number to designate that the element is for the coil 26b driver circuit. The coil 26b circuit is included to illustrate the interaction between coil 26a and coil 26b when a commutation occurs. It is understood by persons skilled in the art that a third driver circuit for coil 26c would typically also be included in a motor with a three coil stator Configured in a wye configuration.

The coil 26b driver circuit is constructed with inverter 100b having an input for receiving the Coil B control logic signal and having an output connected to the control element of current source 102b. The drain of current source 102b is connected to Vdd and the source of current source 102b is connected to the drain of current source 104b, the first plate of capacitor 106b, and the gate of N-channel MOSFET transistor 108b. The control element of 104b is connected to the input of inverter 100b. The second plate of capacitor 106b is connected to ground. The drain of transistor 108b is connected to the drain and gate of P-channel MOSFET transistor 112b and the gate of P-channel MOSFET transistor 114b. The sources of transistors 112b and 114b are connected to Vdd. Transistor 112b and 114b form the first current mirror. The drain of transistor 114b is connected to the drain and gate of n-channel MOSFET transistor 116b and the input of unity gain buffer amplifier 117b. The output of amplifier 117b is connected to the gate of n-channel MOSFET transistor 118b. Transistor 116b, unity gain buffer amplifier, and transistor 118b form the second current mirror where the unity gain amplifier improves the performance of the current mirror. The sources of transistors 116b and 118b are connected to the first end of sense resistor 130. The drain of transistor 118b is connected to the first end of coil 206b. Transistor 120b is the high side driver for coil 26b and is shown with its drain connected to Vdd and its source connected to the first end of coil 26b.

The first end of sense resistor 130 is connected to the inverting input of operational transconductance amplifier 132 (OTA 132). The non-inverting input of OTA 132 receives a $V_{in}$ signal. The output of OTA 132 is connected to the second end of resistor 110 in drive circuit 80a and the second end of resistor 110b in drive circuit 80b.

In steady state operation, the current through a given coil is controlled by the $V_{in}$ signal in combination with the coil A, coil B, and coil C signals. For example, in a phase in which coil 26a is driven, the coil A signal turns on current source 102 to charge capacitor 106 such that transistor 108 is in the on state. Therefore, the current flowing through transistor 108 will be controlled by OTA 132 responsive to the $V_{in}$ signal and the feedback voltage from the sense resistor 130. The current through transistor 108 controls the current through the first current mirror, of transistors 112 and 114, which, in turn, controls the second current mirror of transistors 116 and 118, thus the current through the low-side driver transistor 118. While coil 26a is in the steady on state, coil 26b would be turned off by coil B signal, with current source 102b off and current source 104b on. In this state, any charge on capacitor 106b would be discharged by current source 104b. Consequently, transistor 108b is held in the off state since the voltage on capacitor 106b is held low by current source 104b. Therefore, the first current mirror made up of transistor 112b and 114b are in the off state which in turn keep transistors 116b and 118b turned off.

Figure 4:
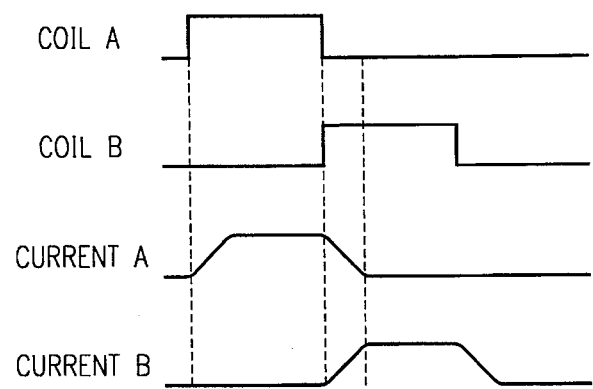
FIG. 4 is a timing diagram of the input signals to FIG. 3 and the current wave forms for stator coils 26a and 26b.

FIG. 4 illustrates the relative signal timing for the Coil A control logic signal and the Coil B control logic signal when the two phases are commutating. The Coil A control logic signal shows coil 26a being turned on and then being turned off. The Coil B control logic signal shows coil 26b being turned on at the precise time that the coil 26a signal is being turned off. The resulting Current A wave form shows the current ramping down from a steady state value to zero as Coil A has been turned off. At the same time, the Current B waveform shows the current in the 26b coil ramping from a zero current to a steady state current at the same, but opposite, rate as the current a waveform is going from the steady state value to zero.

During commutation, the control logic signal Coil A is going from high to low while the control logic signal Coil B is going from low to high. Therefore, current source 102 is being turned off while current source 104 is being turned on at the same time that current source 102b is being turned on and current source 104b is being turned off. The charge on capacitor 106 is going from a full charge to a zero charge at the same time the charge on capacitor 106b is going from no charge to a full charge. As a consequence, the current through coil 26a ramps down from its steady state value to zero at the same time that the current through coil 26b ramps up to a steady state value. The steady state value is ultimately controlled by OTA 132 and $V_{in}$ signal, as explained earlier. Therefore, the commutation is controlled in a manner such that the total current in coil 26a and 26b remains substantially constant. Consequently, noise due to the commutation is reduced in both linear and PWM modes. Stability is also increased due to the absence of local feedback for the slew rate control. This invention is compatible with both low-side driver regulation as well as series pass regulation.

Figure 5:
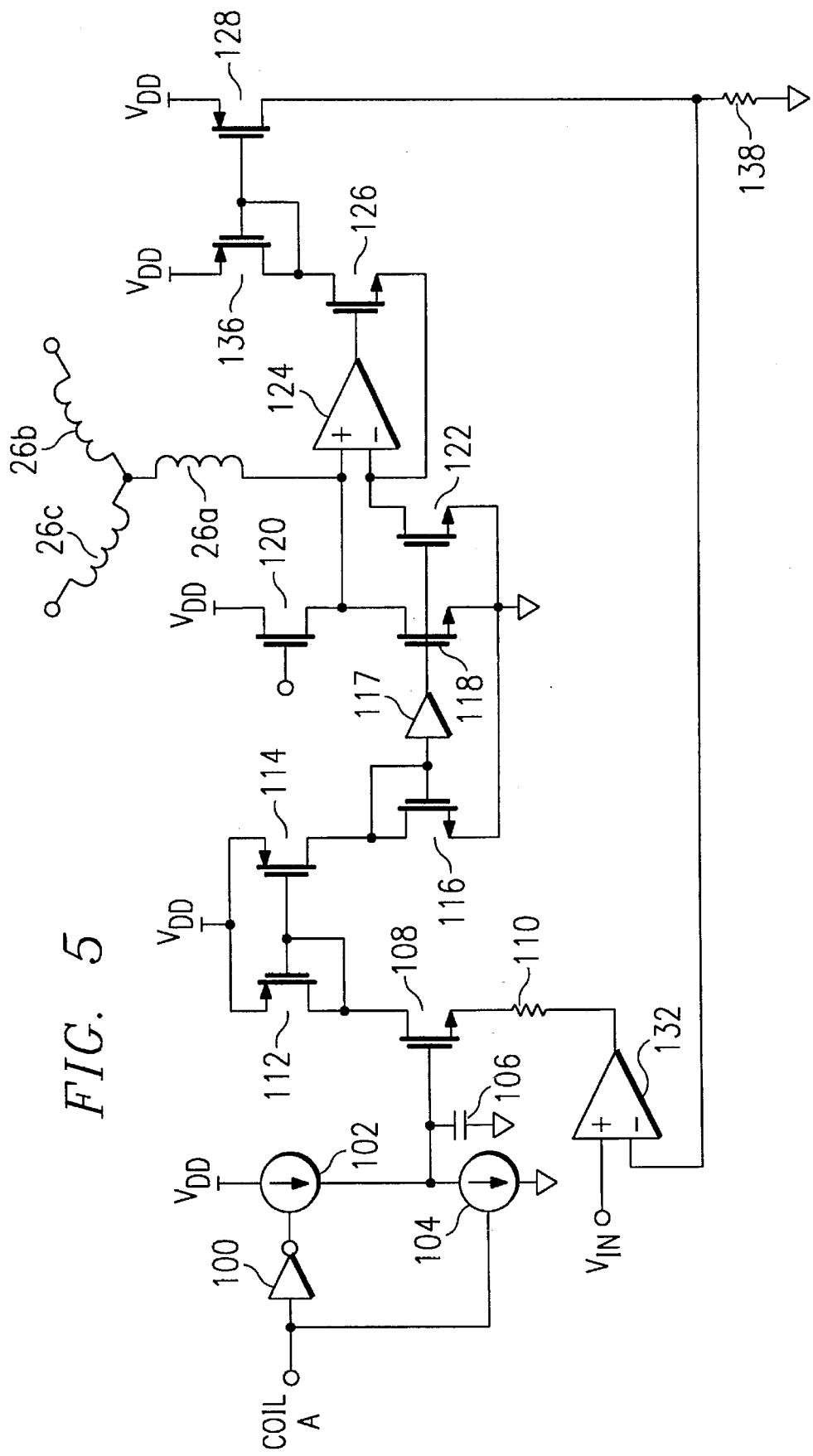
FIG. 5 is a schematic diagram of an embodiment of a driver circuit using a sensefet (current mirror) in the place of a sense resistor.

FIG. 5 shows an alternative embodiment where the sense resistor of FIG. 3 is replaced with sensefet (current mirror) circuitry. More specifically, the alternative embodiment in FIG. 5 is constructed with inverter 100 having an input and having an output connected to the control element of current source 102. The drain of current source 102 is connected to Vdd while the source of current source 102 is connected to the drain of current source 104, the first plate of capacitor 106, and the gate of N-channel MOSFET transistor 108. The control element of current source 104 is connected to the input of inverter 100 and the source of current source 104 is connected to ground. The second plate of capacitor 106 is connected to ground. The drain of transistor 108 is connected to the drain and gate of P-channel MOSFET transistor 112 and the gate of P-channel MOSFET transistor 114. The sources of transistors 112 and 114 are connected to Vdd. Transistor 112 and 114 make up the first current mirror of the circuit. The drain of transistor 114 is connected to the drain and gate of N-channel MOSFET transistor 116 and the input of amplifier 117. The output of amplifier 117 is connected to the gate of N-channel MOSFET transistor 118. Transistor 116 and 118 make up the second current mirror of the circuit. N-channel transistor 120 is the high side driver for coil 26a.

The sensefet circuit includes transistor 122 which has its gate connected to transistor 118. The drain of transistor 122 is connected to the inverting input of amplifier 124, the non-inverting input is connected to the drain of transistor 118. The output of amplifier 124 is connected to the gate of N-channel MOSFET transistor 126. The drain of transistor 126 is connected to a current mirror composed of transistors 136 and 128. The source of transistor 128 is connected to Vdd and the drain of transistor 128 is connected to the inverting input of OTA 132 and resistor 138.

Transistor 122, amplifier 124, transistor 126, and transistor 128 operate to provide a voltage to OTA 132 which is proportional to the current through transistor 118. Therefore, the sensefet (current mirror) circuit take the place of the sense resistor 130 in FIG. 3. This circuit also offers the advantages of the commutation being controlled in a manner such that the total current in coil 26a and 26b remains a constant. Consequently, noise due to the commutation is reduced in both linear and PWM modes. Stability is also increased due to the absence of local feedback for the slew rate control.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

Also, bipolar transistors may replace MOS devices at will.

We claim:

1. A plurality of driver circuits for maintaining a constant total current in a plurality of stator coils, each said driver circuit comprising:

a stator coil drive circuit having a first input, a second input, and having a conductive path with a first end connected to the stator coil and having a second end;

a sense circuit for sensing the current through the stator coil, having a first end connected to said second end of the conductive path of said stator coil drive circuit and having a second end connected to a voltage reference; and a slew rate control circuit having an input connected to receive a control logic signal and having an output connected to said second input of the stator coil drive circuit;

wherein the slew rate control circuit comprises:

an inverter having an input for receiving the control logic signal and having an output;

a first constant current source having a control element connected to the output of the inverter, having a current drain connected to a voltage source and having a current source connected to the control element of a first transistor;

a second constant current source having a control element connected to the input of the inverter, having a current drain connected to the control element of the first transistor, and having a current source connected to the voltage reference; and a capacitor having a first plate connected to the control element of the first transistor and having a second plate connected to the voltage reference such that the first constant current source charges the capacitor or the second constant current source discharges the capacitor responsive to the control logic signal, the resulting voltage on the capacitor controls the first transistor;

said plurality of driver circuits sharing a feedback operational transconductance amplifier which has a first input connected to said first end of each sense circuit, a second input for receiving a stator coil drive signal, and an output connected to the first input of each said stator coil drive circuit.

2. A plurality of driver circuits for maintaining a constant total current in a plurality of stator coils, each said driver circuit comprising:

a stator coil drive circuit having a first input, a second input, and having a conductive path with a first end connected to the stator coil and having a second end;

a sense circuit for sensing the current through the stator coil, having a first end connected to said second end of the conductive path of said stator coil drive circuit and having a second end connected to a voltage reference; and a slew rate control circuit having an input connected to receive a control logic signal and having an output connected to said second input of the stator coil drive circuit;

wherein the stator coil circuit comprises a first current mirror in series with a second current mirror;

said plurality of driver circuits sharing a feedback operational transconductance amplifier which has a first input connected to said first end of each sense circuit, a second input for receiving a stator coil drive signal, and an output connected to the first input of each said stator coil drive circuit.

3. A plurality of driver circuits for maintaining a constant total current in a plurality of stator coils, each driver circuit comprising:

a stator coil drive circuit having an input, and having conductive path with a first end connected to the stator coil and having a second end;

a sense resistor for sensing the current through the stator coil, having a first end connected to said second end of the conductive path of said stator coil drive circuit and having a second end connected to a voltage reference;

a first transistor having a current path with a first end connected to said input of said stator coil drive circuit, having a second end, and having a control element;

a resistor having a first end connected to said second end of the current path of said first transistor and having a second end connected to the output of a feedback operational transconductance amplifier; and a slew rate control circuit having an input connected to a control logic signal and having an output connected to the control element of said first transistor;

said plurality of driver circuits sharing said feedback operational transconductance amplifier which has a first input connected to said first end of each sense resistor, a second input for receiving a stator coil drive signal, and an output.

4. The driver circuit of claim 3 wherein the slew rate control circuit comprises:

an inverter having an input for receiving the control logic signal and having an output;

a first constant current source having a control element connected to the output of the inverter, having a current drain connected to a voltage source and having a current source connected to the control element of the first transistor;

a second constant current source having a control element connected to the input of the inverter, having a current drain connected to the control element of the first transistor, and having a current source connected to the voltage reference; and a capacitor having a first plate connected to the control element of the first transistor and having a second plate connected to the voltage reference such that the first constant current source charges the capacitor or the second constant current source discharges the capacitor responsive to the control logic signal, the resulting voltage on the capacitor controls the first transistor.

5. The driver circuit of claim 3 wherein the stator coil drive circuit comprises a first current mirror in series with a second current mirror.

6. The driver of claim 3 wherein the first transistor comprises a MOSFET transistor.

7. The driver circuit of claim 6 wherein the first transistor comprises a n-channel MOSFET transistor.

8. A plurality of driver circuits for maintaining a constant total current in a stator coil, each driver circuit comprising:

a means for driving current in a stator coil having an input, and having conductive path with a first end connected to the stator coil and having a second end;

a sensefet current mirror means for sensing the current through the stator coil, said sensefet current mirror means having an output;

a first transistor having a current path with a first end connected to the input of the means for driving current in a stator coil and having a second end, and having a control element;

a resistor having a first end connected to said second end of the current path of said first transistor and having a second end connected to the output of a feedback operational transconductance amplifier; and a means for slew rate control circuit having an input connected to receive a control logic signal and having an output connected to the control element of said first transistor;

said plurality of driver circuits sharing said feedback operational transconductance amplifier, which has a first input connected to the output of each sensefet current mirror means for sensing the current through the stator coil, a second input for receiving a stator coil drive signal, and an output.

9. The driver circuit of claim 8 wherein the means for slew rate control circuit comprises:

an inverter having an input for receiving the control logic signal and having an output;

a first constant current source having a control element connected to the output of the inverter, having a current drain connected to a voltage source and having a current source connected to the control element of the first transistor;

a second constant current source having a control element connected to the input of the inverter, having a current drain connected to the control element of the first transistor, and having a current source connected to a voltage reference; and a capacitor having a first plate connected to the control element of the first transistor and having a second plate connected to the voltage reference such that the first constant current source discharges the capacitor or the second constant current source discharges the capacitor responsive to the control logic signal, the resulting voltage on the capacitor controls the first transistor.

10. The driver circuit of claim 8 wherein the stator coil driver circuit comprises a first current mirror in series with a second current mirror.

11. The driver circuit of claim 8 wherein the first transistor comprises a MOSFET transistor.

12. The driver circuit of claim 11 wherein the first transistor comprises a n-channel MOSFET transistor.

13. A disk drive system having a stator, a rotor, a commutation circuit, a means for determining the position of the rotor, and a plurality of driver circuits, wherein each driver circuit further comprises:

a stator coil drive circuit having an input, and having a conductive path with a first end connected to the stator coil and having a second end;

a sense resistor for sensing the current through the stator coil, having a first end connected to said second end of the conductive path of the stator coil drive circuit and having a second end connected to a voltage reference;

a first transistor having a current path with a first end connected to the input of said stator coil drive circuit and having a second end, and having a control element;

a resistor having a first end connected to said second end of the current path of said first transistor and having a second end connected the output of a feedback operational transconductance amplifier; and a slew rate control circuit having an input connected to receive a control logic signal and having an output connected to the control element of said first transistor;

said plurality of driver circuits sharing said feedback operation transconductance amplifier having a first input connected to said first end of each sense resistor, a second input for receiving a stator coil drive signal, and an output.

14. The disk drive system of claim 13 wherein the slew rate control circuit comprises:

an inverter having an input for receiving the control logic signal and having an output;

a first constant current source having a control element connected to the output of the inverter, having a current drain connected to a voltage source and having a current source connected to the control element of the first transistor;

a second constant current source having a control element connected to the input of the inverter, having a current drain connected to the control element of the first transistor, and having a current source connected to the voltage reference; and a capacitor having a first plate connected to the control element of the first transistor and having a second plate connected to the voltage reference such that the first constant current source charges the capacitor or the second constant current source discharges the capacitor responsive to the control logic signal, the resulting voltage on the capacitor controls the first transistor.

15. The disk drive system of claim 13 wherein the stator coil drive circuit comprises a first current mirror in series with a second current mirror.

16. The disk drive system of claim 13 wherein the first transistor comprises a MOSFET transistor.

17. The disk drive system of claim 13 wherein the first transistor comprises an n-channel MOSFET transistor.

* * * * *